(12) United States Patent
Vangal et al.

(10) Patent No.: US 6,504,412 B1
(45) Date of Patent: Jan. 7, 2003

(54) STORAGE ELEMENT WITH SWITCHED CAPACITOR

(75) Inventors: Sriram R. Vangal, Hillsboro, OR (US); Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/663,750

(22) Filed: Sep. 15, 2000

(51) Int. Cl.[7] .................................................. G06F 7/64
(52) U.S. Cl. ........................ 327/203; 327/337; 327/210; 327/212; 327/218
(58) Field of Search .................................. 327/202, 203, 327/204, 206, 215, 337, 434, 211, 93, 94, 199, 200, 201, 210, 212, 208, 218

(56) References Cited

U.S. PATENT DOCUMENTS

| | | | | |
|---|---|---|---|---|
| 4,418,402 A | * | 11/1983 | Heagerty et al. ............ 327/208 |
| 4,806,786 A | * | 2/1989 | Valentine .................... 327/203 |
| 5,467,038 A | | 11/1995 | Motley et al. .............. 327/185 |
| 5,612,632 A | * | 3/1997 | Mahant-Shetti ............. 326/203 |
| 5,654,658 A | * | 8/1997 | Kubota et al. .............. 327/202 |
| 5,821,791 A | * | 10/1998 | Gaibotti et al. ............. 327/202 |
| 5,973,529 A | * | 10/1999 | Chappell et al. ............ 327/200 |
| 5,982,211 A | * | 11/1999 | Ko ............................. 327/202 |
| 6,002,284 A | * | 12/1999 | Hill et al. ................... 327/202 |
| 6,094,385 A | * | 7/2000 | Trimberger ................. 365/200 |
| 6,211,713 B1 | * | 4/2001 | Uhlmann .................... 327/211 |

* cited by examiner

Primary Examiner—Tuan T. Lam
Assistant Examiner—Linh Nguyen
(74) Attorney, Agent, or Firm—Schwegman, Lundberg, Woessner & Kluth, P.A.

(57) ABSTRACT

A latch includes a pair of inverters cross-coupled between a storage node and a feedback node. A capacitor is conditionally coupled to the feedback node through a pass gate such that the capacitor is coupled to the feedback node when the latch holds data and is not coupled to the feedback node when the latch is loading. The capacitor reduces the latch's susceptibility to soft errors when holding data, and does not appreciably slow the latch when data is loading. The capacitor is implemented using the gate capacitance of complementary transistors. A flip-flop includes cascaded latches, one or more of which have a switched capacitor on a feedback node.

20 Claims, 5 Drawing Sheets

STORAGE ELEMENT WITH SWITCHED CAPACITOR

FIELD

The present invention relates generally to integrated circuits, and more specifically to integrated circuits having increased soft error rate tolerance.

BACKGROUND

Integrated circuits commonly include storage elements such as latches that retain state information and hold data. During a portion of a time cycle, or clock period, these storage elements hold data to be used during subsequent time cycles. When storage elements reliably retain data, computations can be error free. In contrast, when storage elements do not reliably retain data, computation errors can result.

Cosmic rays and charged particles can cause integrated circuits to be unreliable. When particles bombard portions of integrated circuits, localized areas of charge can build up on an integrated circuit die and cause stored information to be upset. For example, latches having transistors with diffusion regions can be susceptible to bombardment of charged particles. As particles bombard an integrated circuit die about a diffusion region held at a low voltage, the voltage can increase. Likewise, as particles bombard an integrated circuit about a diffusion region held at a high voltage, the voltage can decrease. When the bombardment is significant, the change in voltage in the diffusion region can cause the latch to change state, thereby causing a "soft error" to occur.

The addition of capacitance to a path-exclusive feedback node in a latch circuit is one known method for mitigating the above-described effects. Capacitance provides "capacity" to store a given amount of charge with less voltage change. One drawback of additional capacitance is reduced circuit speed. When the latch circuit changes state, the output voltage value changes, and the additional capacitance is charged as the voltage value changes. Although additional capacitance can reduce the latch circuit's susceptibility to soft errors, the speed of the latch circuit is reduced in part because the additional capacitance is charged as the voltage value changes.

FIG. 1 shows a prior art latch. Latch 100 includes forward inverter 118 and feedback inverter 110 cross-coupled together. Forward inverter 118 drives feedback node 114 which is input to feedback inverter 110. Feedback inverter 110 in turn drives storage node 112 which is input to forward inverter 118. Latch 100 passes data from data input node 102 to data output node 122 when pass gate 104 is closed. Pass gate 104 is closed when the clock signal on node 108 is high, and the inverse clock signal on node 106 is low. Latch 100 holds data when the clock signal on node 108 is low, and the inverse clock signal on node 106 is high.

When latch 100 is holding data, storage node 112 is at a stable logical state of either logical "1" or logical "0," and buffer 120 drives data output node 122. Forward inverter 118 receives the stored data value on storage node 112, and drives feedback node 114 to the opposite logical state than that of storage node 112. Feedback inverter 10 receives the opposite logical state on feedback node 114, and drives storage node 112 with the original stored data value.

Capacitor 116 is coupled to feedback node 114. When charge accumulates on feedback node 114 as a result of cosmic rays or other noise sources, capacitor 116 reduces. the voltage variations for a given amount of charge, and reduces the likelihood of a soft error. Along with reducing the likelihood of a soft error, capacitor 116 acts as a low-pass filter, and reduces the speed with which feedback node 114 changes voltage. The addition of buffer (or inverter).120 allows the data output node 122 to change voltage quickly without regard to the presence of capacitor 116, but also consumes additional area and power.

For the reasons stated above, and for other reasons stated below which will become apparent to those skilled in the art upon reading and understanding the present specification, there is a need in the art for improved integrated circuit elements with reduced susceptibility to soft errors.

DESCRIPTION OF EMBODIMENTS

Figure 1:
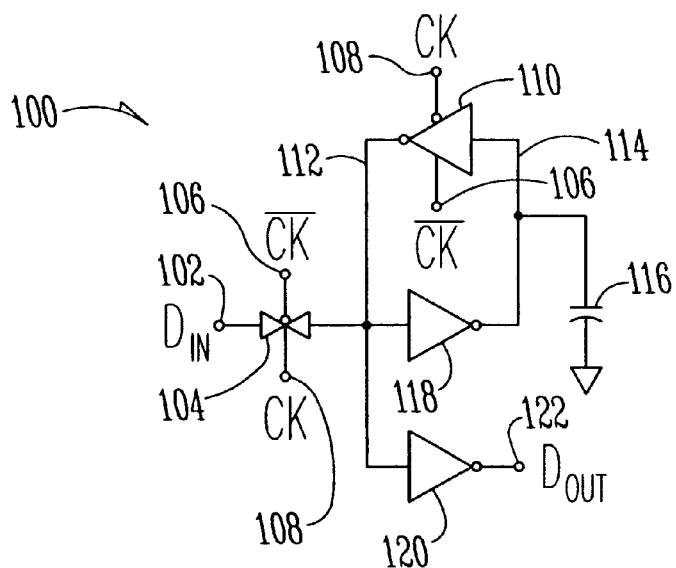
FIG. 1 shows a prior art latch.

In the following detailed description of the embodiments, reference is made to the accompanying drawings which show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

As used herein, the term NFET describes N channel field effect transistors, of which N channel Metal Oxide Semiconductor (NMOS) FETs are an example, and the term PFET describes P channel field effect transistors, of which P channel Metal Oxide Semiconductor (PMOS) FETs are an example. FET devices include diffusion regions coupled to the drain of the FET and-the source of the FET. Diffusion regions can collect charge resulting from cosmic rays and particles that bombard the integrated circuit die. Particles that bombard the bulk of the integrated circuit die can cause negatively charged electrons or positively charged holes to collect in diffusion regions of FETs and cause soft errors.

Figure 2:
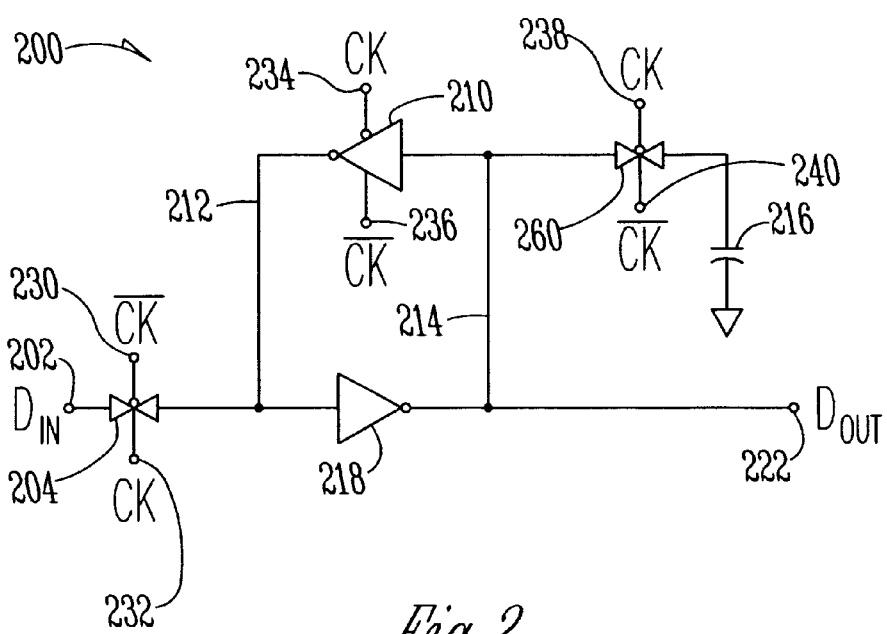
FIG. 2 is a diagram of a latch with a switched capacitor.

FIG. 2 shows a latch according to one embodiment of the present invention. Latch 200 includes forward inverter 218, feedback inverter 210, capacitor 216, pass gate 260, and pass gate 204. Inverters 218 and 210 are cross-coupled such that when in steady-state, they latch a data value. When the output of feedback inverter 210 is a logical "0," the input of forward inverter 218 is also a logical "0." The output of forward inverter 218 is a logical "1," which causes the output of feedback inverter 210 to remain in its present state of logical "0." One can see, therefore, that cross-coupled inverters 210 and 218 work to latch a logical state. Forward inverter 218 drives data output node 222 (labeled "Dout" in FIG. 2).

Various embodiments of circuits are described with reference to circuit nodes having states of logical "1" and logical "0." Circuit nodes are also described as having high voltage and low voltage signals applied thereto. The terms logical "1" and logical "0" generally correspond to a high voltage and a low voltage, respectively. The "logical" terms are used when describing the logical operation of a circuit, and the "voltage" terms are used when describing the circuit more fully. One skilled in the art will understand that a logical inversion can take place while still practicing the present invention. For example, the term logical "1" can correspond to a low voltage, and the term logical "0" can correspond to a high voltage without departing from the scope of the present invention.

Various nodes in latch 200 are shown driven by complementary signals labeled "CK" and "$\overline{CK}$," referred to herein as "the clock signal" and "the inverse of the clock signal," respectively. For example, control inputs 234 and 236 of feedback inverter 210 are shown driven by the clock signal and the inverse of the clock signal, respectively. Also for example, control input nodes 232 and 238 of pass gates 204 and 260 are shown driven by the clock signal, and control input nodes 230 and 240 of pass gates 204 and 260 are shown driven by the inverse of the clock signal. When the clock signal is a logical "1," the inverse of the clock signal is a logical "0." For the purposes of this description, the clock signal and the inverse of the clock signal are sometimes referred to as a single "clock" signal. For example, when the clock signal is referred to as being "high," or as being at a logical "1," this describes the clock signal having a logical state of "1," and the inverse of the clock signal having a logical state of "0." Conversely, when the clock signal is referred to as being "low," or as being at a logical "0," this describes the clock signal having a logical state of "0," and the inverse of the clock signal having a logical state of "1." Feedback inverter 210 is a "clocked inverter" that includes two control inputs. The state of signals on positive control input node 236 and negative control input node 234 influence the behavior of feedback inverter 210. As previously described, positive control input node 236 and negative control input node 234 are driven by the inverse of the clock signal and the clock signal, respectively. When the clock signal is high, feedback inverter 210 becomes an open circuit, and when the clock signal is low, feedback inverter 210 operates as an inverter. The operation of feedback inverter 210 as a clocked inverter is described more fully with respect to the remaining figures.

Pass gates 204 and 260 are transmission gates that pass a signal from one side to the other when signals on the control input nodes are at specific states. In the embodiment of FIG. 2, pass gates 204 and 260 have complementary control input nodes driven by the clock signal and the inverse of the clock signal. For example, pass gate 204 has positive control input node 232 driven by the clock signal, and has negative control input node 230 driven by the inverse of the clock signal. Also for example, pass gate 260 has positive control input node 240 driven by the inverse of the clock signal, and has negative control input node 238 driven by the clock signal. Pass gates 204 and 260: are closed when the positive control input nodes are driven high, and the negative control input nodes are driven low. Conversely, the pass gates are open when the positive control input nodes are driven low and the negative control input nodes are driven high. In other embodiments, different types of pass gates are used. For example, it is not necessary that pass gates 204 and 260 have complementary control input nodes.

Latch 200 is loaded when pass gate 204 is closed as a result of the clock signal being asserted high. When pass gate 204 is closed, data input node 202 (labeled "Din" in FIG. 2) is coupled to storage node 212. The input of forward inverter 218 is driven with the data present on data input node 202. If the data is the same as the previous data stored on storage node 212, then the output of forward inverter 218 does not change state. If the data is not the same as the previous data on storage node 212, the output of forward inverter 218 changes state. During the load operation, the clock signal is high, feedback inverter 210 is not in the circuit, and capacitor 216 is isolated from feedback node 214.

Because capacitor 216 is isolated from feedback node 214 during a load operation, data on data output node 222 can respond quickly to changes of data on data input node 202. As a result, propagation delays in latch 200 are kept low during a load operation.

When the clock signal transitions from high to low, pass gates 204 and 260 change state, and feedback inverter 210 turns on and becomes cross-coupled with forward inverter 218, thereby forming a latch. Pass gate 204 opens and isolates data input node 202 from storage node 212. Pass gate 260 closes and electrically connects capacitor 216 to feedback node 214.

Capacitor 216 presents a capacitive load on feedback node 214 that allows latch 200 to be more tolerant of charge accumulation. As charge builds up on any components coupled to feedback node 214, for example on the diffusion regions on the output of forward inverter 218 or the diffusion regions of pass gate 260, capacitor 216 accepts the charge while allowing the voltage on feedback node 214 to change more slowly. As a result, latch 200 is more tolerant of charge accumulation, and soft errors are less likely to occur.

Figure 3A:
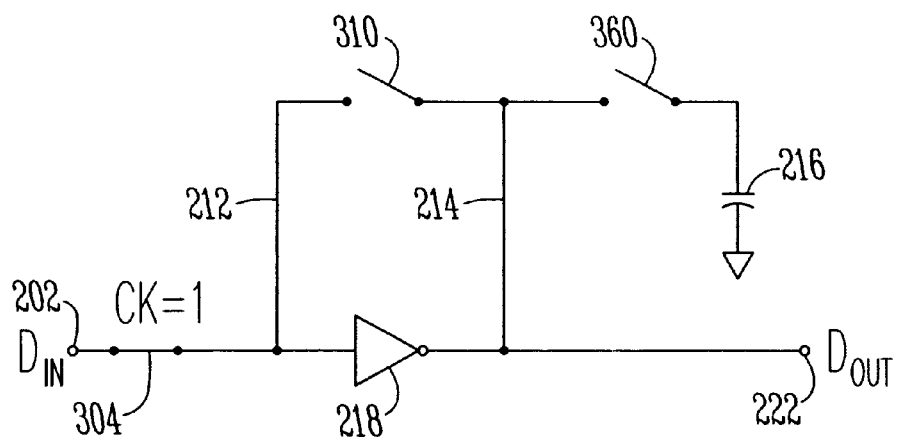
FIGS. 3A and 3B are diagrams showing different logical states of the latch of FIG. 2.
Figure 3B:
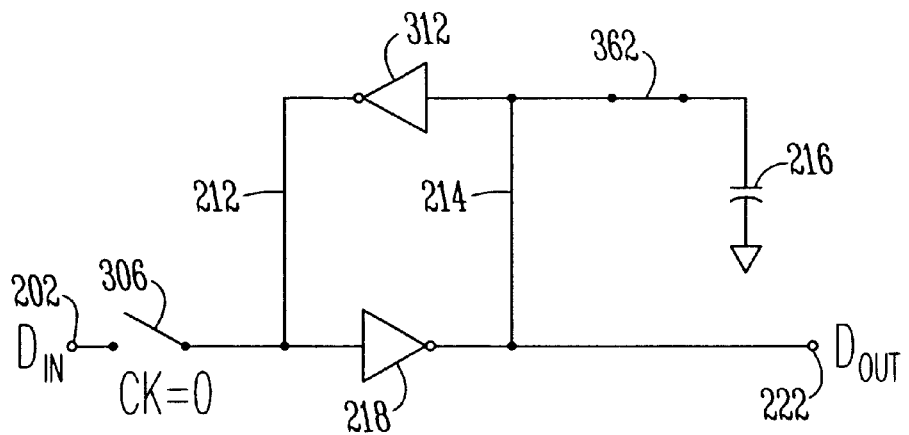

FIGS. 3A and 3B schematically show the state of latch 200 when it is loading, and when it is latched, respectively. FIG. 3A shows the state of latch 200 when the clock signal is high and the inverse of the clock signal is low. Pass gate 204 is shown as closed switch 304, pass gate 260 is shown as open switch 360, and feedback inverter 210 is shown as open switch 310. Because feedback inverter 210 and capacitor 216 are not in the circuit, the circuit behaves as an inverter with input data driven on data input node 202 and output data on data output node 222. Data on data input node 202 can quickly drive the input to forward inverter 218 because the drive strength of the feedback inverter need not be overcome, and data on data output node 222 can change quickly because capacitor 216 is not in the circuit.

FIG. 3B shows the state of latch 200 when the clock signal is low and the inverse of the clock signal is high. This occurs when latch 200 is no longer loading, but instead, is latched. Pass gate 204 is shown as open switch 306, pass gate 260 is shown as closed switch 362, and feedback inverter 210 is shown as inverter 312. Because feedback inverter 210 is now in the circuit, the circuit behaves as a latch with cross-coupled inverters holding state information. Because capacitor 216 is in the circuit, feedback node 214 is more tolerant of charge accumulation, and fewer soft errors result.

Figure 4:
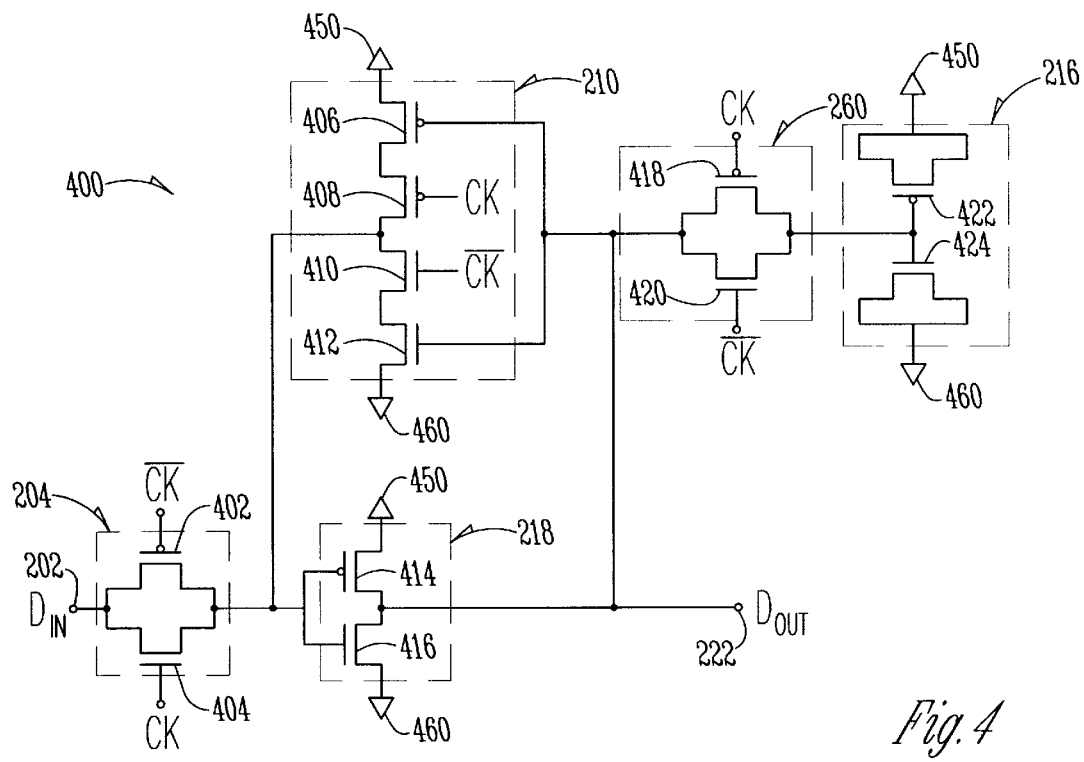
FIG. 4 is a transistor-level diagram of a latch with a switched capacitor.

FIG. 4 is a transistor-level diagram of a latch according to one embodiment of the present invention. Latch 400, in the embodiment shown in FIG. 4, implements latch 200 (FIG.

2), and reference numerals from FIG. 2 are included to show which portions of latch 400 correspond to elements in latch 200. For example, pass gate 204 is implemented as PFET 402 in parallel with NFET 404, and pass gate 260 is implemented with PFET 418 and NFET 420 in parallel. Forward inverter 218 is implemented with PFET 414 and NFET 416, and feedback inverter 210 is implemented with PFETs 406 and 408 and NFETs 410 and 412. Capacitor 216 is implemented with PFET 422 and NFET 424.

When the clock is high, PFET 402 and NFET 404 are on, and PFETs 418 and 408 and NFETs 420 and 410 are off. This is the load condition shown in FIG. 3A. Pass gate 204 is a closed switch, pass gate 260 is an open switch, and feedback inverter 210 is removed from the circuit. When the clock is low, the PFETs and NFETs driven by the clock signal and the inverse of the clock signal change state, and the latch holds data. This condition is shown in FIG. 3B. Pass gate 204 is an open switch, pass gate 260 is a closed switch, and. feedback inverter 210 is in the circuit.

In the embodiment shown in FIG. 4, capacitor 216 is implemented with PFET 422 and NFET 424. PFET 422 and NFET 424 each have a gate that is coupled to one terminal of pass gate, 260. Capacitance is provided by the gate capacitance of PFET 422 and NFET 424. The source and drain of PFET 422 are coupled to voltage reference 450 and the source and drain of NFET 424 are coupled to voltage reference 460. In some embodiments, one of PFET 422 and NFET 424 is omitted, and the capacitance is provided by a single gate capacitance. In other embodiments, the capacitance is provided using mechanisms other than FET gate capacitance.

NFET 420 and PFET 418 of pass gate 260 add a small amount of diffusion capacitance to the feedback node. This capacitance is small compared to the gate capacitance provided by NFET 424 and PFET 422.

Figure 5:
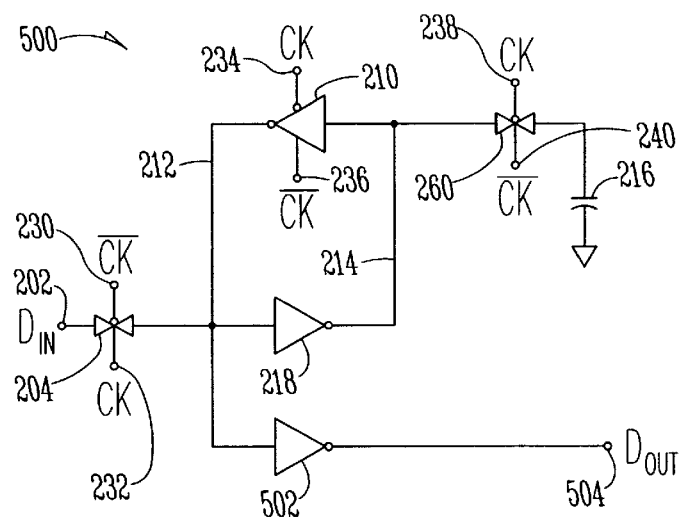
FIG. 5 is a diagram of another latch with a switched capacitor.

FIG. 5 is a diagram of a latch according to another embodiment of the present invention. Latch 500 includes all of the elements included in latch 200 (FIG. 2), and further includes buffer 502. Buffer 502 can be any type of buffer capable of driving data output node 504. In the embodiment of FIG. 5, buffer 502 is inverting. In other embodiments, buffer 502 is a non-inverting buffer. Buffer 502 provides further isolation between the data output node and capacitor 216.

Figure 6:
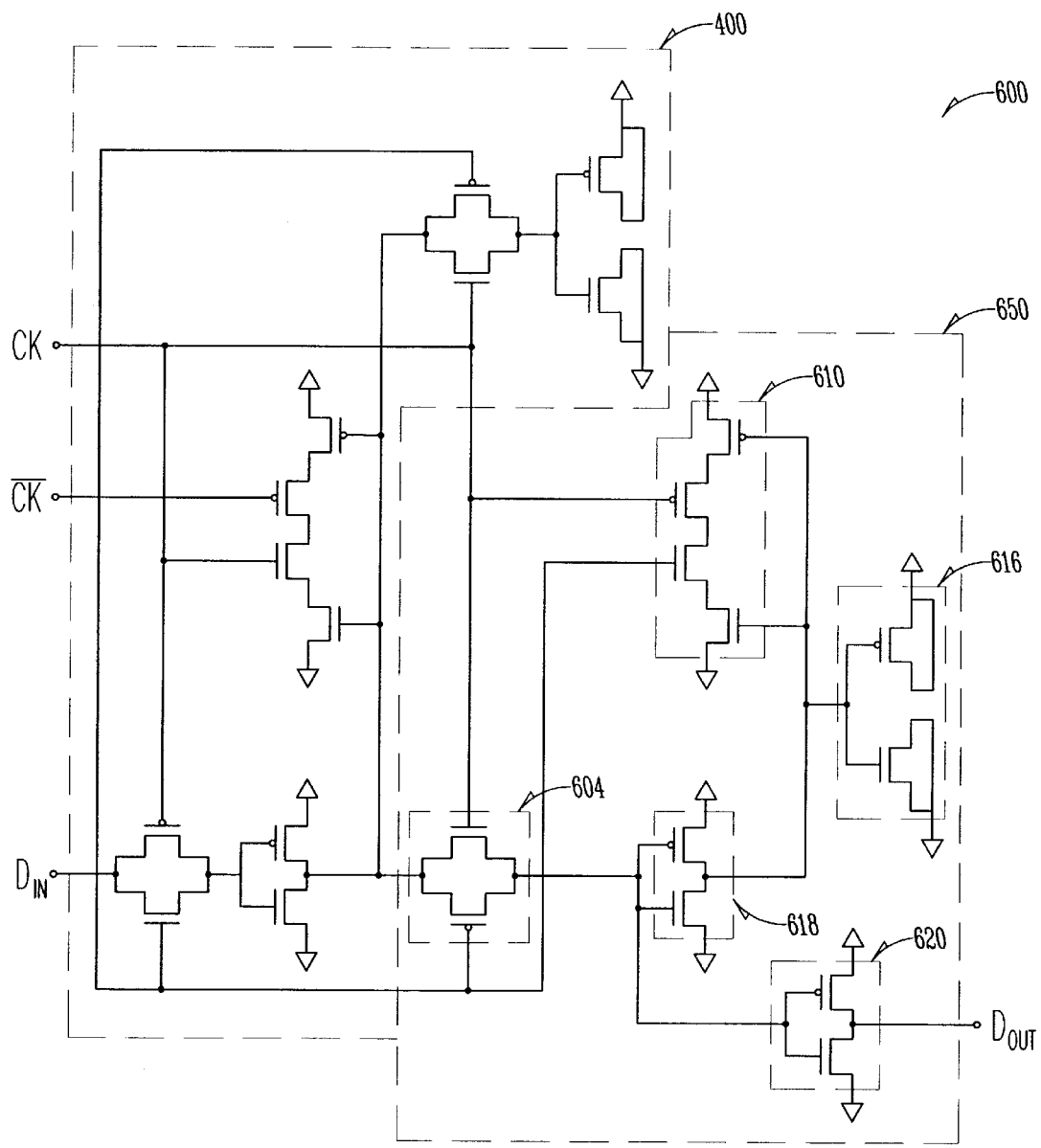
FIG. 6 is a diagram of a flip-flop.

FIG. 6 shows a flip-flop according to an embodiment of the present invention. Flip-flop 600 includes two latches: a master latch and slave latch cascaded together. Latch 400 operates as the master latch and, in some embodiments, is the same latch as shown in FIG. 4. Latch 650 is the slave latch. Latch 650 includes pass gate 604, forward inverter 618, feedback inverter 610, capacitor 616, and buffer 620. In the flip-flop embodiment shown in FIG. 6, both latches 400 and 650 include capacitance on feedback nodes to reduce susceptibility to charge accumulation. In latch 400, the capacitor is conditionally coupled to the feedback node as described above. In latch 650, the capacitor is directly connected to the feedback node, and a pass gate is not utilized. Also in latch 650, buffer 620 isolates capacitor 616 from the data output node.

In some embodiments, flip-flop 600 includes two latches 400 cascaded, rather than latch 400 and latch 650 as shown in FIG. 6. In these embodiments, both the master and slave latch include pass gates that conditionally couple capacitance on the feedback node. In other embodiments, a latch with a buffer and the conditional capacitance is used as they slave latch. For example, in some embodiments, latch 400 (FIG. 4) drives latch 500 (FIG. 5) to create a flip-flop. Many possible embodiments exist as permutations of cascaded latches to create flip-flops, and these embodiments are intended to be within the scope of the present invention.

Figure 7:
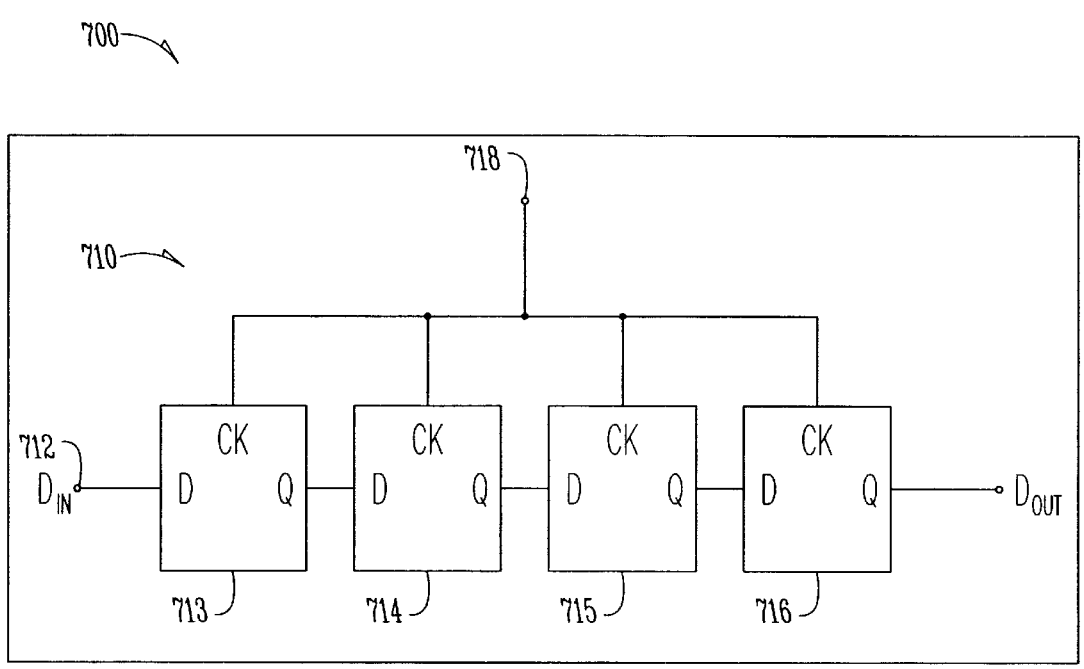
FIG. 7 is a diagram of an integrated circuit.

FIG. 7 shows an integrated circuit in accordance with one embodiment of the present invention. Integrated circuit 700 includes data path 710, which in turn includes storage elements 713, 714, 715, and 716. Storage elements 713–716 can be any embodiment disclosed herein, such as latch 200 or flip-flop 600. Storage element 713 receives data on data input node 712 which corresponds to a data input node such as data input node 202 (FIGS. 2–5). Storage element 713 outputs data which is then input to storage element 714. After storage element 714, the data travels to storage element 715 and storage element 716 in a like manner. Storage elements 713–716 receive a clock signal on clock node 718. The clock signal shown in FIG. 7 corresponds to the clock signals shown in previous figures. In some embodiments, for example when storage elements 713–716 are latches, storage elements 713 and 715 respond to one edge of a clock signal on clock node 718, and storage elements 714 and 716 respond to the opposite edge of the clock signal on clock node 718. In other embodiments, for example when all of storage elements 713–716 are flip-flops, all of storage elements 713–716 respond to the same edge of the clock. signal.

Integrated circuit 700 can be any integrated circuit capable of including a storage element such as latch 200 (FIG. 2) or flip-flop 600 (FIG. 6). Integrated circuit 700 can be a processor such as a microprocessor, a digital signal processor, a microcontroller, or the like. Integrated circuit 700 can also be an integrated circuit other than a processor such as an application-specific integrated circuit (ASIC), a communications device, a memory controller, or a memory such as a dynamic random access memory (DRAM).

It is to be understood that the above description is intended to be illustrative, and not restrictive. Many other embodiments will be apparent to those of skill in the art upon reading and understanding the above description. The scope of the invention should therefore, be determined with reference to the appended claims, along with the full scope of equivalents to which such claims are entitled.

What is claimed is:

1. A circuit comprising:
   an input switch to conditionally couple an input node to a storage node;
   a forward inverter to couple the storage node to a feedback node;
   a clocked inverter having an input coupled to the feedback node of the circuit, and an output coupled to the storage node to form a latch;
   a capacitive load;
   a capacitor switch to conditionally couple the capacitive load to the feedback node;
   a second input switch to couple the feedback node to a second storage node;
   a second forward inverter to couple the second storage node to a second feedback node; and
   a second clocked inverter cross-coupled to the second forward inverter to form a flip-flop.

2. The circuit of claim 1 wherein the input switch and capacitor switch are responsive to opposite phases of a signal on a clock input node.

3. The circuit of claim 1 further comprising a second capacitor conditionally coupled to the second feedback node.

4. The circuit of claim 3 further comprising a second capacitor switch coupled between the second capacitor and the second feedback node, wherein the first and second input switches are responsive to opposite phases of a signal on a clock input node.

5. A flip-flop circuit comprising:
   a first latch including first cross-coupled inverters coupled between a first storage node and a first feedback node, and a capacitor coupled to the first feedback node through a first pass gate; and
   a second latch including a second storage node coupled to the first feedback node through a second pass gate, and second cross-coupled inverters coupled between the second storage node and a second feedback node.

6. The flip-flop circuit of claim 5 wherein the first cross-coupled inverters comprise:
   a forward inverter having an input node coupled to the storage node and an output coupled to the feedback node; and
   a clocked feedback inverter having an input coupled to the feedback node and an output coupled to the storage node.

7. The flip-flop circuit of claim 6 wherein the capacitor comprises a MOSFET having a gate coupled to the first pass gate.

8. The flip-flop circuit of claim 6 wherein the capacitor comprises:
   an n-channel transistor having a gate coupled to the first pass gate and source and drain coupled to a first reference node; and
   a p-channel transistor having a gate coupled to the first pass gate and source and drain coupled to a second reference node.

9. The flip-flop circuit of claim 5 wherein the first and second pass gates are coupled to a clock node such that both first and second pass gates are closed on a common phase of a clock signal.

10. The flip-flop circuit of claim 9 further comprising a second capacitor on the second feedback node.

11. The flip-flop circuit of claim 10 wherein the second capacitor is connected to the second feedback node such that a capacitance is provided to the second feedback node regardless of the phase of the clock signal.

12. The flip-flop circuit of claim 9 further comprising an output inverter having an input coupled to the second storage node and an output coupled to an output node. of the flip-flop circuit.

13. An integrated circuit including a data path, the data path including at least one storage element, the at least one storage element including:
   an input switch to conditionally couple an input node to a storage node;
   a forward inverter to drive a feedback node, the forward inverter having an input node coupled to the storage node;
   a clocked inverter cross coupled with the forward inverter to form a latch;
   a capacitive load;
   a capacitor switch to conditionally couple the capacitive load to the feedback node;
   a second input switch to couple the feedback node to a second storage node;
   a second forward inverter; and
   a second clocked inverter cross-coupled to the second forward inverter.

14. The integrated circuit of claim 13 wherein the input switch and capacitor switch are responsive to opposite phases of a signal on a clock node.

15. The integrated circuit of claim 13 wherein the integrated circuit is a microprocessor.

16. The integrated circuit of claim 13 wherein the integrated circuit is a memory.

17. The circuit of claim 1 wherein the capacitor switch comprises a pass gate responsive to a clock input node.

18. The circuit of claim 1 wherein the capacitive load comprises a MOSFET having a gate coupled to the capacitor switch and having a source and drain coupled together.

19. The circuit of claim 18 wherein the capacitive load comprises:
   an NMOSFET having a gate coupled to the capacitor switch and a source and drain coupled to a first reference node.

20. The circuit of claim 19 wherein the capacitive load further comprises:
   a PMOSFET having a gate coupled to the capacitor switch and a source and drain coupled to a second reference node.

\* \* \* \* \*

UNITED STATES PATENT AND TRADEMARK OFFICE
CERTIFICATE OF CORRECTION

PATENT NO. : 6,504,412 B1
DATED : January 7, 2003
INVENTOR(S) : Tanay Karnik and Sriram R. Vangal It is certified that error appears in the above-identified patent and that said Letters Patent is hereby corrected as shown below:

Column 1,
Line 67, delete "." after "reduces".

Column 2,
Line 5, delete "." after "(or inverter)".
Line 55, delete "-" after "and".

Column 3,
Line 65, delete ":" after "260".

Column 5,
Line 23, delete "," after "gate".
Line 66, delete "they" and insert -- the -- therefor.

Column 6,
Line 25, delete "." after "clock".
Line 40, insert -- , -- after "should".

Column 8,
Line 1, delete "." after "node".

Signed and Sealed this

Twentieth Day of July, 2004

JON W. DUDAS
*Acting Director of the United States Patent and Trademark Office*